United States Patent
Hasegawa et al.

(10) Patent No.: US 9,083,136 B1
(45) Date of Patent: Jul. 14, 2015

(54) SEMICONDUCTOR LASER LIGHT SOURCE

(71) Applicant: Mitsubishi Electric Corporation, Tokyo (JP)

(72) Inventors: Yuki Hasegawa, Tokyo (JP); Mitsuaki Futami, Tokyo (JP); Toru Yoshihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/558,366

(22) Filed: Dec. 2, 2014

(30) Foreign Application Priority Data

Feb. 13, 2014 (JP) ................... 2014-025038

(51) Int. Cl.
*H01S 5/022* (2006.01)
*H01S 5/40* (2006.01)

(52) U.S. Cl.
CPC ............. *H01S 5/02208* (2013.01); *H01S 5/022* (2013.01); *H01S 5/02236* (2013.01); *H01S 5/40* (2013.01); *H01S 5/4087* (2013.01)

(58) Field of Classification Search
CPC ....... H01S 5/022; H01S 5/02236; H01S 5/40; H01S 5/4087
USPC .......................................... 372/50.12, 50.121
See application file for complete search history.

(56) References Cited

U.S. PATENT DOCUMENTS

| 5,402,436 | A | 3/1995 | Paoli |
| 2011/0063871 | A1* | 3/2011 | Tanaka et al. ................ 362/553 |
| 2013/0089116 | A1* | 4/2013 | Okura ...................... 372/50.121 |

FOREIGN PATENT DOCUMENTS

| JP | 7-211991 A | 8/1995 |
| JP | 2009-111230 A | 5/2009 |
| JP | 2011-243717 A | 12/2011 |
| WO | WO 2014/184844 A1 | 11/2014 |

* cited by examiner

*Primary Examiner* — Armando Rodriguez
(74) *Attorney, Agent, or Firm* — Birch, Stewart, Kolasch & Birch, LLP

(57) ABSTRACT

A semiconductor laser light source includes a semiconductor laser block mounted on a stem which is a support base, the semiconductor laser block which is a block has a plurality of surfaces, and a plurality of semiconductor laser chips emit laser light beams of different wavelengths, respectively. Each of the semiconductor laser chips is mounted on each surface of the semiconductor laser block.

7 Claims, 5 Drawing Sheets

SEMICONDUCTOR LASER LIGHT SOURCE

BACKGROUND OF THE INVENTION

1. Field of the Invention

The present invention relates to a light source including a semiconductor laser.

2. Description of the Background Art

As light sources for lighting devices and display devices, replacing short-lived lamps, semiconductor light-emitting elements such as semiconductor laser diodes (LD) or light-emitting diodes (LED) have come to be used. As for this kind of applications, light-emitting elements corresponding to the three colors of red, green and blue, which are so-called the three primary colors of light, are used.

There is a limit to increasing illumination with the light of a conventionally-used lamp, and the illumination on a screen becomes darker as the screen becomes larger. However, a laser light beam has such properties as high directivity, coherence and energy density, and therefore, a higher illumination may be obtained by adding a plurality of laser light beams. However, when coherent light such as a laser light beam is illuminated on a screen, a pattern including glaringly shiny spots called speckle noise is observed, and gives discomfort to those who are looking at the screen. The speckle noise appears due to an interference effect, which is a property of a laser light beam, and is a factor to lower the quality of lighting and displayed images.

Therefore, specifically when a light source includes a semiconductor laser, a request for a higher power output and reducing the speckle noise becomes stronger.

In order to emit a high power output laser light beam and reduce the speckle noise, a conventional semiconductor laser light source includes two semiconductor diode arrays each of which has a plurality of active regions, which are laser light beam emission points, and each of the semiconductor diode arrays is determined to be a multi-beam laser diode array configured to emit a plurality of laser beams (laser light beams) of different properties. It is considered that increasing the active regions enables to emit a plurality of laser light beams, and adding these laser light beams together enables to obtain higher power output and multi-wavelengths (see, for example, Japanese Patent Application Laid-Open No. 07-211991 (1995)).

In addition, another semiconductor laser light source emits a laser light beam with high brightness and high power output by using a fiber-coupling method used to optically couple light beams from a plurality of semiconductor lasers to an optical fiber (see, for example, Japanese Patent Application Laid-Open No. 2011-243717).

Furthermore, another semiconductor laser light source reduces the speckle noise by emitting lasers of different wavelengths from a semiconductor laser array having a plurality of light emission points (see, for example, Japanese Patent Application Laid-Open No. 2009-111230).

However, according to a technology described in Japanese Patent Application Laid-Open No. 07-211991 (1995), a semiconductor laser chip including active regions, which are laser light beam emission points, is required to be mounted on a semiconductor laser block because thermal resistance should be considered, and the width of the semiconductor laser chip has to be increased so as to increase the active regions and emit a plurality of laser light beams. If the semiconductor laser block is specified to a certain size, there is a limit to the number of active regions that can be mounted on the semiconductor laser block. If the size of the semiconductor laser block is made large, the number of mountable active regions is increased, but there has been a problem that the overall structure of the semiconductor laser light source becomes large.

In addition, according to a technology described in Japanese Patent Application Laid-Open No. 2011-243717, by using a fiber coupling, laser light beams from a plurality of semiconductor laser arrays are condensed and a laser light beam with high power output is emitted. However, one semiconductor laser array having radiation emitters configured to emit laser light beams is mounted on one semiconductor laser block, and therefore, the number of semiconductor laser blocks is required to be increased so as to emit a laser light beam with higher power output. With the increase of the number of the semiconductor laser blocks, emitting a laser light beam with high power output is made possible, but there has been a problem that the semiconductor laser light source becomes large.

Furthermore, according to a technology described in Japanese Patent Application Laid-Open No. 2009-111230, one semiconductor laser array having a plurality of light emission points is mounted on one heat sink (semiconductor laser block), and therefore, the number of semiconductor laser blocks is required to be increased so as to emit a laser light beam with higher power output. With the increase of the number of the semiconductor laser blocks, emitting a laser light beam with high power output is made possible, but there has been a problem that the semiconductor laser light source becomes large.

SUMMARY OF THE INVENTION

It is an object of the present invention to provide a semiconductor laser light source which reduces the size of the device and is capable of emitting a laser light beam with high power output and reduced speckle noise.

A semiconductor laser light source according to the present invention includes a block mounted on a support base and having a plurality of surfaces, and a plurality of semiconductor laser chips emit laser light beams of different wavelengths, respectively. Each of the semiconductor laser chips is mounted on each surface of the block.

Each of the semiconductor laser chips is mounted on each surface of the block, and therefore, a semiconductor laser light source that can obtain high power output and reduce speckle noise with a minimum number of components without adding any component can be achieved. Thus, the semiconductor laser light source can be achieved with a minimum number of components, and therefore, it is possible to reduce the size of the device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
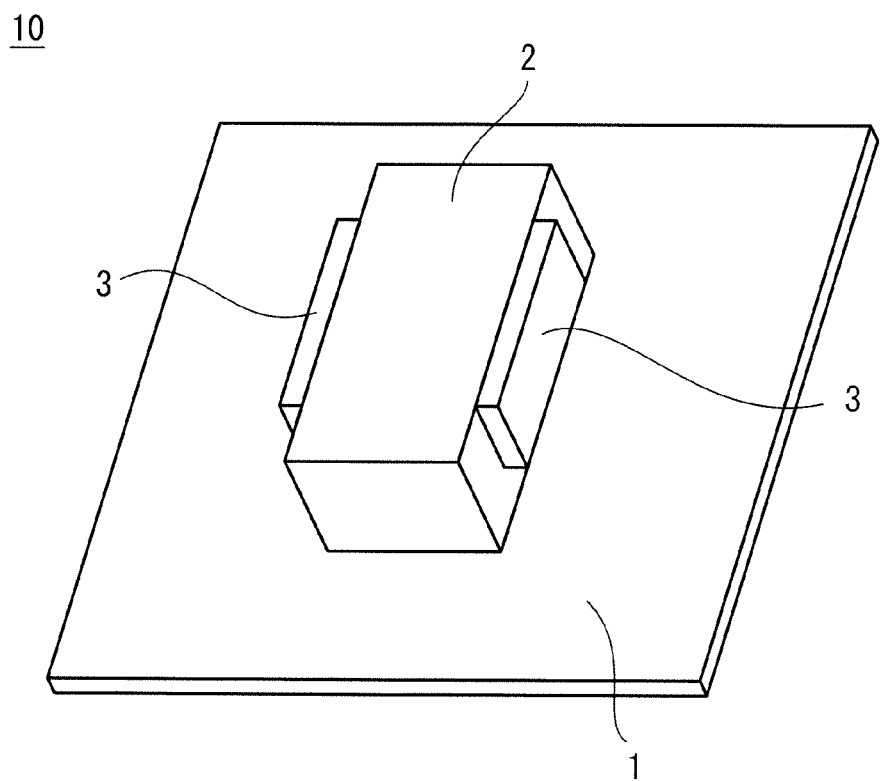
FIG. 1 is a perspective view of a semiconductor laser light source according to a first preferred embodiment.

Hereinafter, a first preferred embodiment of the present invention will be described with reference to the drawings. FIG. 1 is a perspective view of a semiconductor laser light source 10 according to the first preferred embodiment, and FIG. 2 is a cross-sectional view of the semiconductor laser light source 10 according to the first preferred embodiment.

Figure 2:
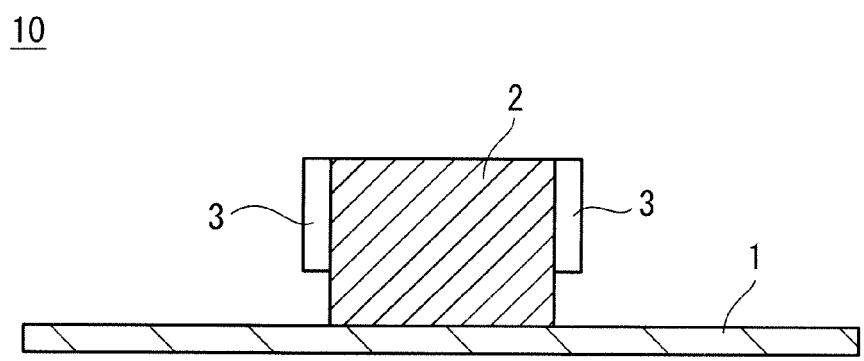
FIG. 2 is a cross-sectional view of the semiconductor laser light source according to the first preferred embodiment.

As shown in FIGS. 1 and 2, the semiconductor laser light source 10 includes a stem 1 (support base), a semiconductor laser block (hereinafter referred to as an "LD block") 2 that is a block configured to mount a semiconductor laser chip, and a plurality of (two, for example) semiconductor laser chips (hereinafter referred to as "LD chips") 3. It should be noted that electrodes for supplying currents to the LD chips 3 are omitted because they are not directly related to the present invention.

The LD block 2 is formed into a rectangular parallelepiped shape using metal, for example. That is, the LD block 2 has a plurality of (six) surfaces. The LD block 2 is mounted on the stem 1 by the lower surface of the LD block 2 being fixed to the upper surface of the stem 1. Each surface of the LD block 2 is formed into such a size that a LD chip 3 can be mounted thereon. That is, each surface of the LD block 2 is formed into a larger size than that of the bottom surface of the LD chip 3.

The plurality of LD chips 3 emit laser light beams of different wavelengths, respectively. The basic configuration of the semiconductor laser light source 10 has a structure that one LD block 2 is mounted on the upper surface of the stem 1, and the plurality of LD chips 3 are mounted on the outer surfaces (side surfaces) of the LD block 2. In FIGS. 1 and 2, two of the LD chips 3 are mounted on the side surfaces of the LD block 2, respectively. It should be noted that the plurality of LD chips 3 may be mounted on the four surfaces other than the upper and lower surfaces of the LD block 2.

The conventional semiconductor laser light sources have adopted a method of increasing the surface area or the number of LD blocks as means for emitting a laser light beam with high power output by adding respective laser light beams together using the properties of a laser light beam because one LD chip which is a laser light beam emission point is mounted on one LD block. With this method, there has been a problem that the semiconductor laser light source becomes large, and the weight of the entire device increases as well.

In contrast to such a conventional semiconductor laser light source, the semiconductor laser light source 10 according to the first preferred embodiment has a structure capable of emitting a laser light beam with higher power output in a small device by mounting on one LD block 2 the plurality of LD chips 3 which emits laser light beams of different wavelengths, respectively and condensing each of the laser light beams.

Furthermore, the semiconductor laser light source 10 adds a plurality of laser light beams of different wavelengths together, and therefore, the semiconductor laser light source 10 has a structure capable of emitting a laser light beam that can obtain the effect of speckle noise reduction as well as high power output.

Therefore, in the semiconductor laser light source 10, by mounting the plurality of LD chips 3 that emit laser light beams of different wavelengths on the side surfaces of one LD block 2, the semiconductor laser light source 10 can consequently emit a laser light beam with high power output and reduce the speckle noise without adding any LD block 2.

As described above, in the semiconductor laser light source 10 according to the first preferred embodiment, each of the LD chips 3 is mounted on each surface of the LD block 2, and therefore, the semiconductor laser light source 10 that can obtain high power output and reduce speckle noise with a minimum number of components without adding any component can be achieved. Thus, the semiconductor laser light source 10 can be achieved by the minimum number of components, and therefore, reducing the size of the device is possible, and in addition, reducing manufacturing costs is also possible. Furthermore, the semiconductor laser light source 10 can be achieved with a minimum number of components, and the structure of the device does not complicate, and therefore, improving the yield rate of a semiconductor laser light source 10 is also possible.

The LD block 2 is formed into a rectangular parallelepiped shape, and therefore, it is possible to mount the LD chips 3 on the four surfaces other than the lower surface that is mounted on the stem 1 and the upper surface among the six surfaces of the LD block 2. Thus, it is possible to mount the LD chips 3 on a maximum of four surfaces of the LD block 2, and therefore, it is possible to obtain higher power output and further reduction of the speckle noise.

It should be noted that the shape of the LD block 2 shown in FIG. 1 (rectangular parallelepiped shape) is one example, and if the LD block has a structure capable of mounting the plurality of LD chips 3, the same effect can be obtained even in a shape other than rectangular parallelepiped.

Second Preferred Embodiment

Figure 3:
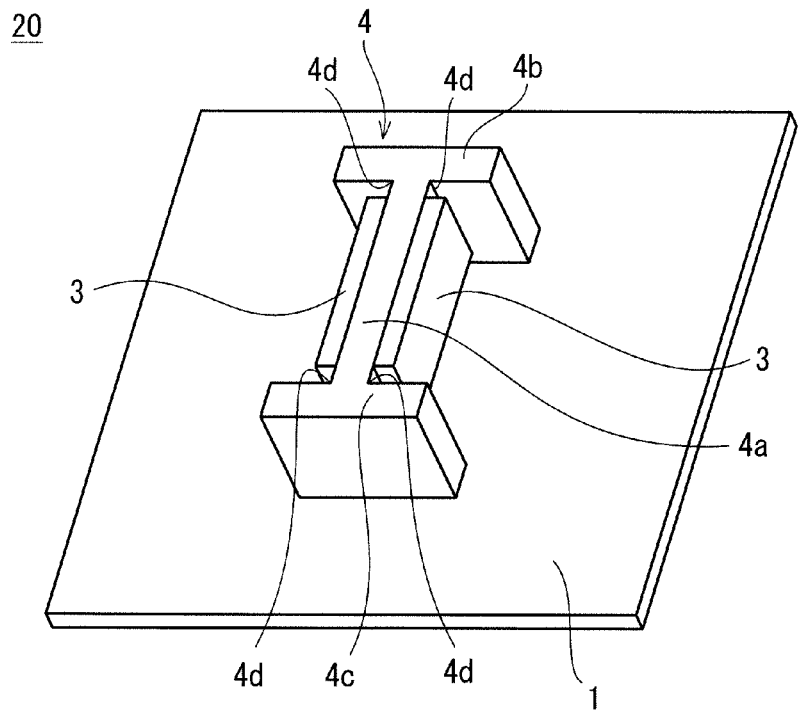
FIG. 3 is a perspective view of a semiconductor laser light source according to a second preferred embodiment.
Figure 4:
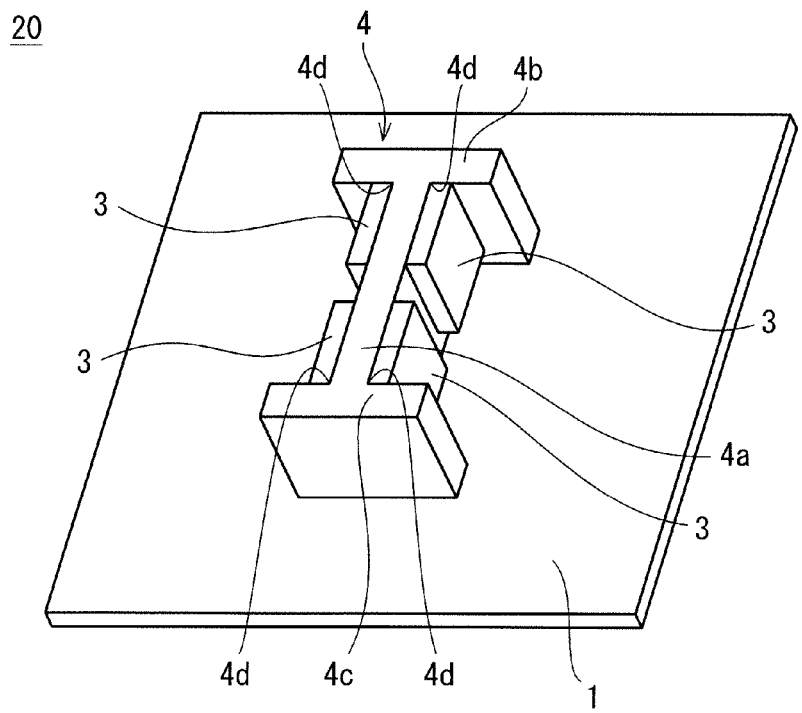
FIG. 4 is a perspective view of the semiconductor laser light source according to the second preferred embodiment, showing a state of positioning corner portions of LD chips at corner portions of an LD block.

A semiconductor laser light source 20 according to a second preferred embodiment will now be described. FIG. 3 is a perspective view of the semiconductor laser light source 20 according to the second preferred embodiment, and FIG. 4 is a perspective view of the semiconductor laser light source 20 according to the second preferred embodiment, showing a state of positioning corner portions of the LD chips 3 at corner portions 4d of the LD block 4. It should be noted that in the second preferred embodiment, the same components as those in the first preferred embodiment are given the same reference marks and detailed descriptions will be omitted.

As shown in FIG. 3, the semiconductor laser light source 20 includes a stem 1, a LD block 4 mounted on the stem 1, and a plurality of (two, for example) LD chips 3. The LD block 4 is formed into I-shape in plan view, and includes a body portion 4a, and protruding portions 4b and 4c. The body portion 4a is formed into a rectangular parallelepiped shape, and the width of the body portion 4a is, for example, formed smaller than the width of the LD block 2 according to the first preferred embodiment. In addition, the body portion 4a includes a plurality of surfaces capable of mounting LD chips 3.

The protruding portions 4b and 4c protrude laterally from both end portions in the longitudinal direction of the body portion 4a. In the LD block 4, two corner portions 4d are formed at the boundary portion of the body portion 4a and the protruding portion 4b, and two corner portions 4d are formed at the boundary portion between the body portion 4a and the protruding portion 4c. The LD chips 3 are formed into a rectangular parallelepiped shape, and the corner portions 4d of the LD block 4 are formed into a shape capable of coming into contact with the corner portions of the LD chip 3.

The basic configuration of the semiconductor laser light source 20 has a structure configured to mount one LD block 4 on the upper surface of the stem 1 and to mount the plurality of LD chips 3 on the outer surfaces (side surfaces) of the body portion 4a of the LD block 4.

It is understood that a semiconductor laser light source provides higher light utilization efficiency and enables to emit a laser light beam with high power output by shortening the arrangement distance of adjacent LD chips. In the LD block 2 according to the first preferred embodiment, if the width of the LD block 2 is decreased so as to shorten the arrangement distance of the adjacent LD chips 3, a problem that the LD block 2 tilts or falls over may occur before joining the lower surface of the LD block 2 and the stem 1.

As shown in FIG. 3, the semiconductor laser light source 20 has a structure including protruding portions 4b and 4c which protrude laterally from both end portions in the longitudinal direction of the body portion 4a of the LD block 4 so that the LD block 4 according to the second preferred embodiment does not fall over nor tilt. Also in the second preferred embodiment, the plurality of LD chips 3 emit laser light beams of different wavelengths, and thereby, the semiconductor laser light source 20 can obtain a multi-wavelength laser light beam, and emit a laser light beam with high power output and reduced speckle noise.

In addition, the semiconductor laser light source requires precise alignment of a lens for condensing the laser light beams from the LD chips 3 and an optical fiber, and by precisely determining the emission point positions, that is, the positions of the LD chips 3 as a reference of alignment, the effects are obtained that the range of alignment is limited, the alignment becomes easy, and in some cases the alignment becomes unnecessary. According to the second preferred embodiment, as shown in FIG. 4, by including the protruding portions 4b and 4c, positioning the corner portions of the LD chips 3 at the corner portions 4d of the LD block 4 is easy and determining precisely emission point positions as a reference of alignment is made possible.

Furthermore, because of the LD chips 3 being precision components, when the LD chips 3 are being mounted on the side surfaces of the body portion 4a of the LD block 4, even if the width of the body portion 4a decreases, an operator can grasp the protruding portions 4b and 4c in the process of manufacturing the semiconductor laser light source 20. Thereby, the operator is able to handle the LD block 4 without touching the LD chips 3.

As described above, in the semiconductor laser light source 20 according to the second preferred embodiment, the LD block 4 includes a body portion 4a with a plurality of surfaces that can mount the LD chips 3, and protruding portions 4b and 4c that protrude laterally from both end portions in the longitudinal direction of the body portion 4a. Therefore, with the aim of emitting a laser light beam with higher power output, even if the width of the body portion 4a is decreased in order to shorten the arrangement distance of the adjacent LD chips 3, the LD block 4 can be prevented from tilting or falling over.

The LD block 4 includes the corner portions 4d capable of coming into contact with the corner portions of the LD chip 3 at the boundary portions between the body portion 4a and the protruding portions 4b and 4c, and therefore, easy alignment is possible and an operator can handle the LD block 4 without touching the LD chips 3 in a manufacturing process.

It should be noted that if the protruding portions 4b and 4c have shapes capable of supporting the body portion 4a, and forming the corner portions 4d at the boundary portions of the body portion 4a and the protruding portions 4b and 4c, the shapes are not limited to those shown in FIGS. 3 and 4.

Third Preferred Embodiment

Figure 5:
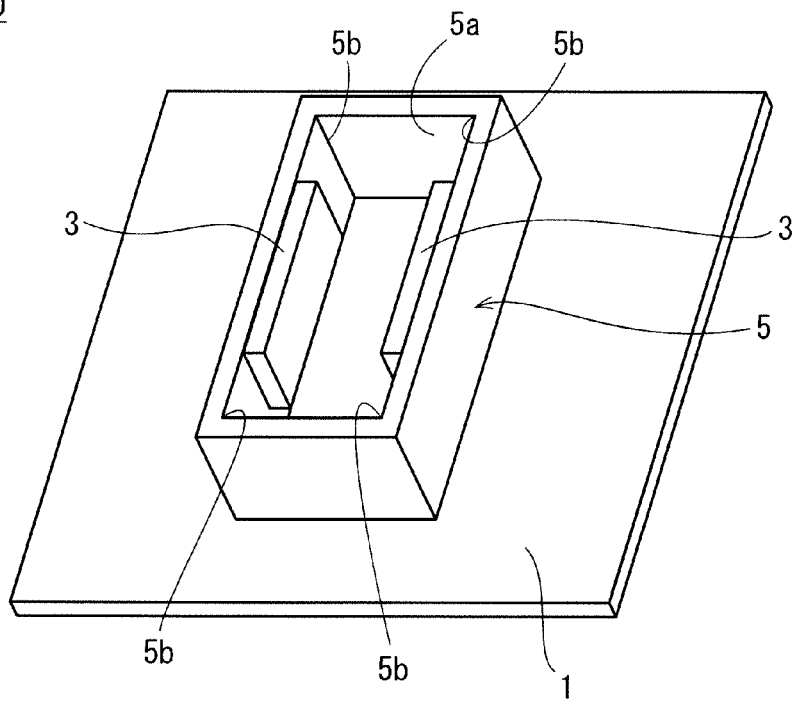
FIG. 5 is a perspective view of a semiconductor laser light source according to a third preferred embodiment.
Figure 6:
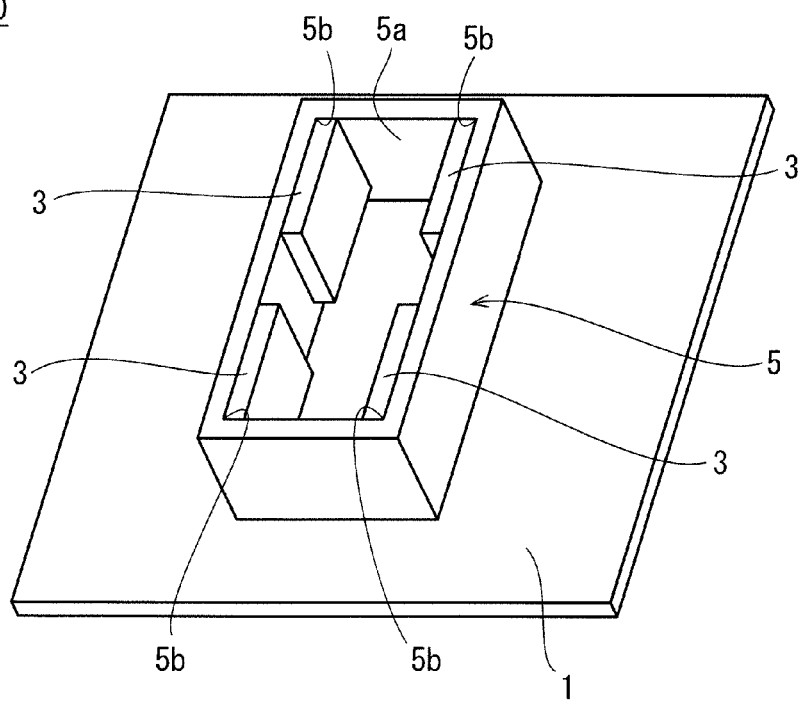
FIG. 6 is a perspective view of the semiconductor laser light source according to the third preferred embodiment, showing a state of positioning corner portions of LD chips at corner portions of an LD block.

Then, a semiconductor laser light source 30 according to a third preferred embodiment will be described. FIG. 5 is a perspective view of the semiconductor laser light source 30 according to the third preferred embodiment, and FIG. 6 is a perspective view of the semiconductor laser light source 30 according to the third preferred embodiment, showing a state of positioning corner portions of the LD chips 3 at corner portions 5b of a LD block 5. It should be noted that in the third preferred embodiment, the same components as those in the first and second preferred embodiments are given the same reference marks and their detailed descriptions will be omitted.

The semiconductor laser light source 30 includes a stem 1, a LD block 5 mounted on the stem 1, and a plurality of (two, for example) LD chips 3. The LD block 5 includes an opening portion 5a in an upward opening shape, and the opening portion 5a is formed by boring in the LD block in a rectangular parallelepiped shape. The opening portion 5a is formed into a rectangular shape in plan view.

The basic configuration of the semiconductor laser light source 30 has a structure in which one bored LD block 5 is mounted on the upper surface of the stem 1 and the plurality of LD chips 3 are mounted on the inner surfaces of the LD block 5 formed by the opening portion 5a. Inside the LD block 5 four surfaces are formed, and each of the four surfaces is formed capable of mounting the plurality of LD chips 3.

For higher light use efficiency and emitting a laser light beam with high power output, by mounting the LD chips 3 on the inner surfaces of the bored LD block 5, it is possible to shorten further the arrangement distance of the adjacent LD chips 3 because the LD block 5 is not disposed between the adjacent LD chips 3. In addition, the LD block 5 has the width of a magnitude capable of supporting itself, and therefore, before the lower surface of the LD block 5 joins the stem 1, such a problem that the LD block 5 falls over or tilts does not occur.

Also according to the third preferred embodiment, the plurality of LD chips 3 emit laser light beams of different wavelengths, and thereby, the semiconductor laser light source 30 obtains a multi-wavelength laser light beam, and emitting a laser light beam with higher power output and reduced speckle noise is possible.

In addition, when the alignment positioning of the lens for condensing the laser light beams from the LD chips 3 and the optical fiber is performed, as shown in FIG. 6, positioning the corner portions of the LD chips 3 at the corner portions 5b of the LD block 5 is easy, and in the same manner as in the second preferred embodiment, it is possible to determine precisely the emission point positions as a reference of alignment.

Furthermore, by using the LD block 5 in a manufacturing process of the semiconductor laser light source, an operator can grasp the side portions of the LD block 5, and therefore, in the same manner as in the second preferred embodiment, it is possible for the operator to handle the LD block 5 without touching the LD chips 3.

As described above, in the semiconductor laser light source 30 according to the third preferred embodiment, the LD block 5 is formed into an upward opening shape and has inside at least three surfaces that can mount LD chips 3. Therefore, mounting the plurality of LD chips 3 on one LD block 5 is possible, and shortening further the arrangement distance of the adjacent LD chips 3 is possible. Thus, the semiconductor laser light source 30 which can emit a laser light beam with higher power output and further reduce the speckle noise can be achieved.

The LD block 5 includes inside the corner portions 5b capable of coming into contact with the corner portions of the LD chip 3, and therefore, in the same manner as in the second preferred embodiment, easy alignment is possible and an operator can handle the LD block 5 without touching the LD chips 3 in a manufacturing process. In addition, the LD block 5 has the width of a magnitude capable of supporting itself, and therefore, the LD block 5 can be prevented from tilting or falling over.

Figure 7:
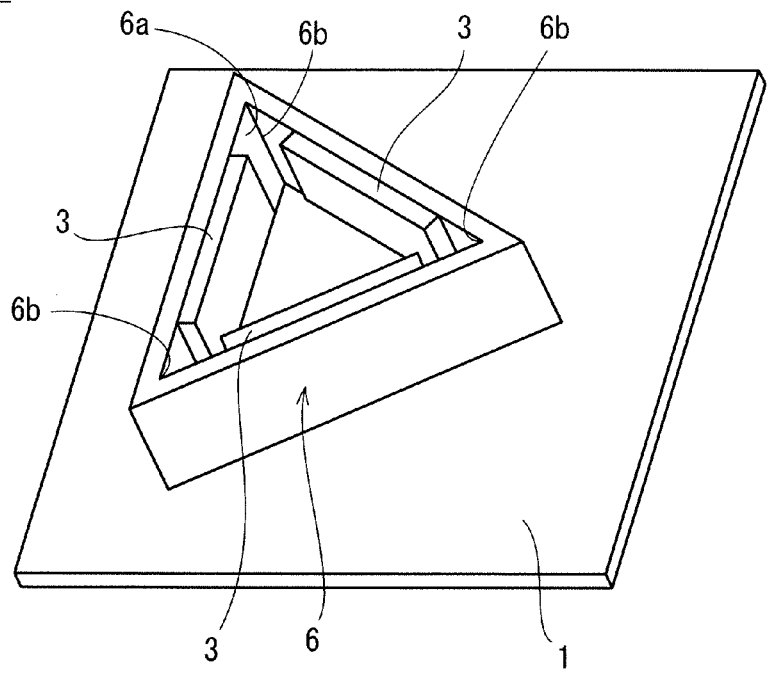
FIG. 7 is a perspective view of a semiconductor laser light source according to a first variation of the third preferred embodiment.
Figure 8:
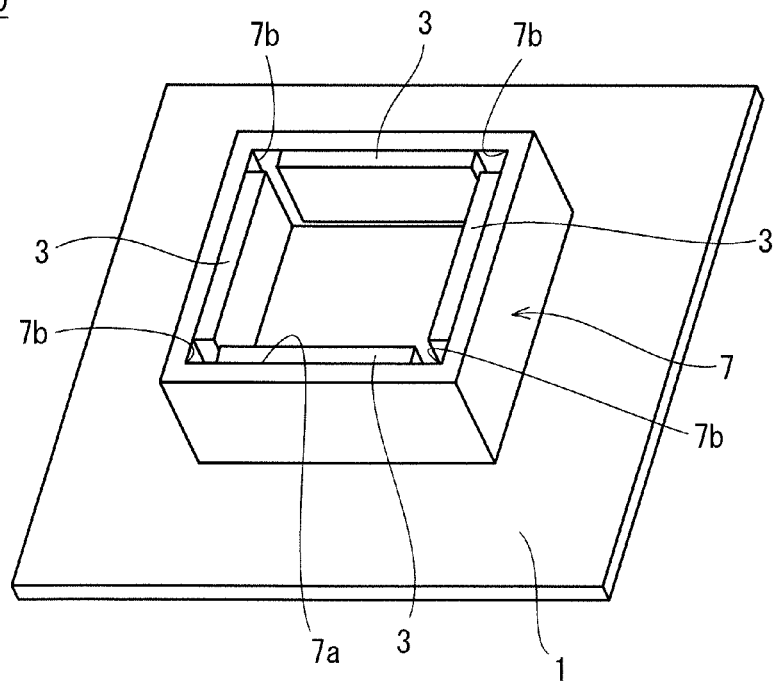
FIG. 8 is a perspective view of a semiconductor laser light source according to a second variation of the third preferred embodiment.
Figure 9:
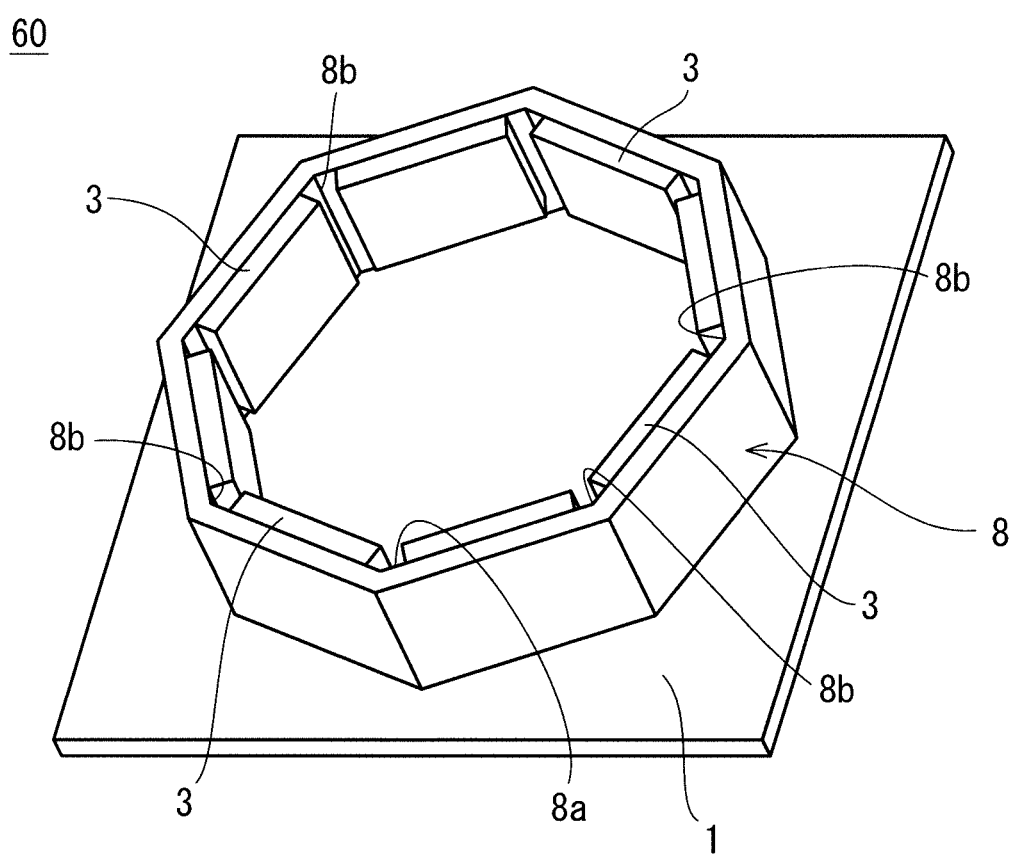
FIG. 9 is a perspective view of a semiconductor laser light source according to a third variation of the third preferred embodiment.

It should be noted that the shape of the LD block 5 as shown in FIGS. 5 and 6 is one example, and if the LD block has a structure capable of mounting a plurality of LD chips 3 inside the LD block as shown in FIGS. 7 to 9, the same effects can be obtained in any shape of the LD block. FIG. 7 is a perspective view of a semiconductor laser light source 40 according to a first variation of the third preferred embodiment, FIG. 8 is a perspective view of a semiconductor laser light source 50 according to a second variation of the third preferred embodiment, and FIG. 9 is a perspective view of a semiconductor laser light source 60 according to a third variation of the third preferred embodiment.

As shown in FIG. 7, an LD block 6 of the semiconductor laser light source 40 is formed into a triangular shape in plan view, and includes an opening portion 6a in an upward opening shape. The opening portion 6a is formed into a triangular shape in plan view. Inside the opening portion 6a, the LD block 6 includes corner portions 6b capable of coming in contact with the corner portions of the LD chip 3. Inside the opening portion 6a, three surfaces are formed, and each of the three surfaces is formed capable of mounting the plurality of LD chips 3.

As shown in FIG. 8, an LD block 7 of the semiconductor laser light source 50 is formed into a square shape in plan view, and includes an opening portion 7a in an upward opening shape. The opening portion 7a is formed into a square shape in plan view. The LD block 7 includes corner portions 7b capable of coming into contact with the corner portions of the LD chip 3 inside the opening portion 7a. Inside the opening portion 7a, four surfaces are formed, and each of the four surfaces is formed capable of mounting the plurality of LD chips 3.

As shown in FIG. 9, an LD block 8 of the semiconductor laser light source 60 is formed into an octagonal shape in plan view, and includes an opening portion 8a in an upward opening shape. The opening portion 8a is formed into an octagonal shape in plan view. The LD block 8 includes corner portions 8b capable of coming into contact with the corner portion of the LD chip 3 inside the opening portion 8a. Inside the opening portion 8a, eight surfaces are formed, and each of the eight surfaces is formed capable of mounting the plurality of LD chips 3.

As described above, even in the case of FIGS. 7 to 9, the same effects as in the case of the semiconductor laser light source 30 can be obtained.

While the invention has been shown and described in detail, the foregoing description is in all aspects illustrative and not restrictive. It is therefore understood that numerous modifications and variations can be devised without departing from the scope of the invention.

What is claimed is:

1. A semiconductor laser light source comprising:
a block mounted on a support base, the block having a plurality of surfaces; and
a plurality of semiconductor laser chips which emit laser light beams of different wavelengths, respectively,
wherein each of said semiconductor laser chips is mounted on each surface of said block, wherein said block includes
a body portion formed into a rectangular parallelepiped shape and having said plurality of surfaces where the said semiconductor laser chips are mounted, and
a protruding portion protruding laterally from both end portions in a longitudinal direction of said body portion in such a manner so that said block forms into an I-shape in plan view.

2. The semiconductor laser light source according to claim 1, wherein said block includes a corner portion capable of coming into contact with a corner portion of said semiconductor laser chip at a boundary portion between said body portion and said protruding portion.

3. A semiconductor laser light source comprising:
a block mounted on a support base, the block having a plurality of surfaces; and
a plurality of semiconductor laser chips which emit laser light beams of different wavelengths, respectively,
wherein each of said semiconductor laser chips is mounted on each surface of said block, wherein said block is formed into an upward opening shape and has inside at least three surfaces capable of mounting said semiconductor laser chips, and wherein each surface shares two corner portions.

4. The semiconductor laser light source according to claim 3, wherein said block includes inside a corner portion capable of coming into contact with a corner portion of said semiconductor laser chip.

5. The semiconductor laser light source according to claim 3, wherein said upward opening portion is formed into a triangular shape in plan view.

6. The semiconductor laser light source according to claim 3, wherein said upward opening portion is formed into a square shape in plan view.

7. The semiconductor laser light source according to claim 3, wherein said opening portion is formed into an octagonal shape in plan view.

* * * * *